United States Patent
Nealis et al.

(10) Patent No.: US 6,264,480 B1
(45) Date of Patent: Jul. 24, 2001

(54) RF EMISSIONS SHIELD INCLUDING RESILIENT FINGERS AND CONNECTOR ASSEMBLY AND METHOD INCLUDING THE SAME

(75) Inventors: Edwin John Nealis, Cary; Quentin Scott Denzene, Apex, both of NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/334,188

(22) Filed: Jun. 16, 1999

(51) Int. Cl.[7] .................................................. H01R 13/648
(52) U.S. Cl. .............................. 439/92; 439/939; 439/927
(58) Field of Search ............................. 439/92, 594, 660, 439/98, 108, 587–581, 701, 439, 710, 712, 723, 927

(56) References Cited

U.S. PATENT DOCUMENTS

| | | | |
|---|---|---|---|
| 4,572,921 | 2/1986 | May et al. | 174/35 GC |
| 4,693,530 * | 9/1987 | Stillie | 439/497 |
| 4,767,345 * | 8/1988 | Gutter et al. | 439/92 |
| 4,906,196 * | 3/1990 | Browman et al. | 439/76 |
| 5,073,120 * | 12/1991 | Lincoln et al. | 439/92 |
| 5,317,105 | 5/1994 | Weber | 174/35 GC |
| 5,672,844 | 9/1997 | Persson et al. | 174/35 R |
| 5,697,799 | 12/1997 | Consoli et al. | 439/181 |
| 5,847,938 | 12/1998 | Gammon | 361/816 |
| 5,856,632 | 1/1999 | Bostrom et al. | 174/35 GC |
| 5,920,984 | 7/1999 | Persson et al. | 29/836 |
| 6,074,223 * | 6/2000 | Huang | 439/95 |
| 6,118,672 * | 9/2000 | Yamauchi | 361/818 |

FOREIGN PATENT DOCUMENTS

| | | | |
|---|---|---|---|
| DE 38 43 948 A1 | 7/1990 | (DE) | H05K/9/00 |
| 0627788 A | 12/1994 | (EP) | H01R/23/68 |
| 10233591 A | 2/1997 | (JP) | H05K/9/00 |

OTHER PUBLICATIONS

"Strip Metal Gaskets and Grounding Products"; Instrument Specialties Internet Website (www.instr.com/ps/ps$_{13}$stripmetgas.html); Mar. 19, 1999.
"Material Characteristics Chart—Fingerstock"; Instrument Specialties Internet Website (www.instr.com/mc/mc$_{13}$fingerstock.html); Mar. 19, 1999.
International Search Report, Sep. 6, 2000, for Application No. PCT/US00/14260.

* cited by examiner

Primary Examiner—Neil Abrams
Assistant Examiner—J. F. Duverne
(74) Attorney, Agent, or Firm—Myers Bigel Sibley & Sajovec

(57) ABSTRACT

An RF emissions shield for grounding a chassis to an associated connector mounted on a backplane includes a shield body, mounting means for securing the shield body to the backplane, and grounding means for electrically connecting the shield body to the connector. At least one spring member is integral with the shield body and is adapted to engage the chassis such that the spring member is biased against the chassis. Preferably, the at least one spring member includes a plurality of curved, resilient fingers extending from an edge of the shield body. The mounting means may include an aperture defined in the shield body, the aperture sized and configured to receive the connector such that at least an engagement portion of the shield body along the aperture engages the connector.

31 Claims, 7 Drawing Sheets

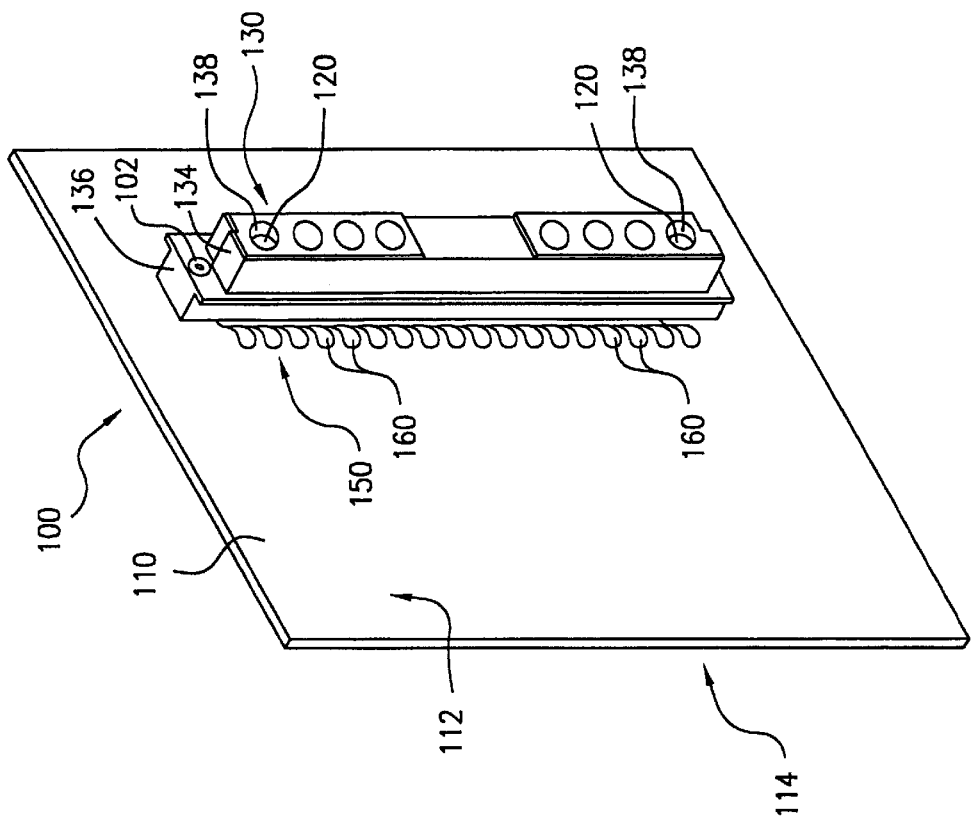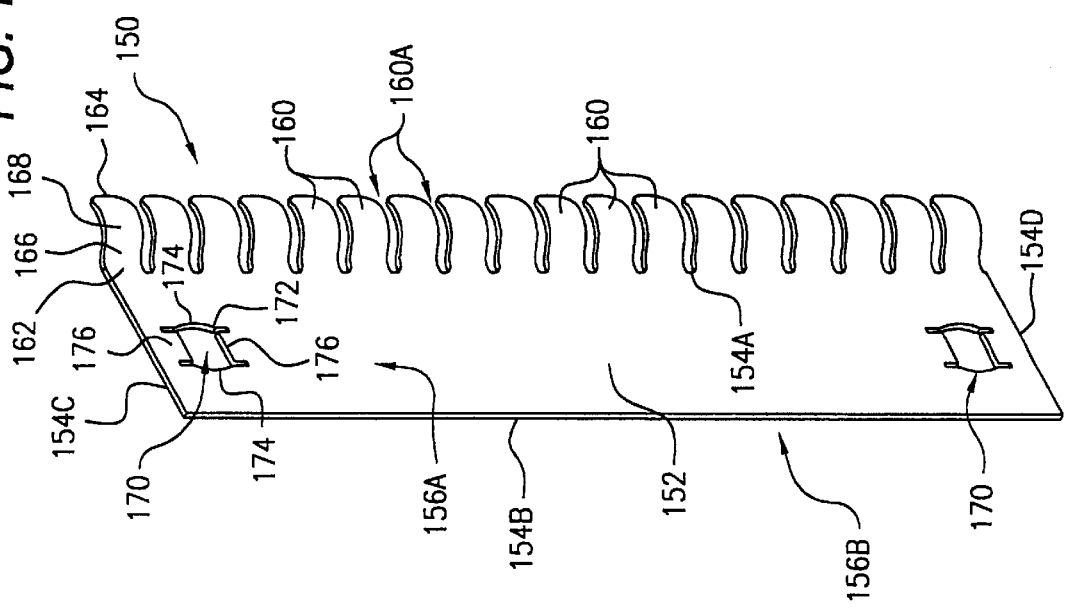

RF EMISSIONS SHIELD INCLUDING RESILIENT FINGERS AND CONNECTOR ASSEMBLY AND METHOD INCLUDING THE SAME

FIELD OF THE INVENTION

The present invention relates to electrical connectors, and, more particularly, to devices and methods for shielding and grounding.

BACKGROUND OF THE INVENTION

Radio frequency (RF) components, assembled boards and modules radiate both desirable and undesirable emissions. The desirable emissions are those that the components, assembled boards and modules are designed to emit. The undesirable emissions should be suppressed to avoid interference with other equipment. In cellular base station equipment, this is especially true because of the close proximity of other components, assembled boards and modules in the base station. Such components may also be subjected to undesirable RF emissions from external sources.

Attempts have been made to provide shielding and grounding to suppress unwanted emissions between RF modules that are mounted closely together and plugged into a common backplane. One attempt to solve this problem utilizes a conductive adhesive gasket and a conductive adhesive tape. The conductive adhesive gasket is applied to the RF module chassis and the conductive adhesive tape is applied to the backplane. When the RF module is mounted, the gasket on the RF module chassis touches the tape on the backplane.

Unfortunately, the adhesive backed gasket is fragile and tends to become damaged with repeated removal and handling of the RF module. The adhesive backed gasket may also peel off rather easily if the backplane surface has not been cleaned and prepared properly prior to application of the gasket. The damaged gasket may fail to seal properly, or worse, may physically interfere with the mounting of the module. Another shortcoming of this technique is that the gasket and the tape are typically aligned and applied by hand. The conductive tape should be properly located to allow proper electrical contact with other portions of the backplane and the mounting frame to which it is fastened. The mounting surfaces should be prepared properly by cleaning, which is also typically a hand operation. The results are often inconsistent, leading to poor quality and poor shield performance.

SUMMARY OF THE INVENTION

The present invention is directed to a shield and grounding method for reducing unwanted emissions between modules that are mounted closely together and plugged into a common backplane. According to one aspect of the present invention, an RF emissions shield for grounding a chassis to an associated connector mounted on a backplane includes a shield body, mounting means for securing the shield body to the backplane, and grounding means for electrically connecting the shield body to the connector. At least one spring member is integral with the shield body and is adapted to engage the chassis such that the spring member is biased against the chassis. Preferably, the at least one spring member includes a plurality of curved, resilient fingers extending from an edge of the shield body.

According to another aspect of the present invention, an RF emissions shield for grounding a chassis to an associated connector mounted on a backplane includes a shield body having an edge. An aperture is defined in the shield body. The aperture is sized and configured to receive the connector such that at least an engagement portion of the shield body along the aperture engages the connector to secure the shield body to the backplane and to electrically connect the shield body to the connector. A plurality of curved, resilient spring fingers extend from the edge. Preferably, the shield body is substantially planar. More preferably, the spring fingers extend above the plane of the shield body. The shield may include a tab integral with the shield body and extending into the aperture, the tab adapted to be deflected by and engage the connector when the connector is inserted into the aperture.

According to a further aspect of the present invention, an RF emissions shielded connector assembly for use with a chassis includes a backplane assembly and a shield for grounding the chassis. The backplane assembly includes a backplane, and a connector extending from the backplane. The shield is secured to the backplane assembly and includes an electrically grounded shield body and at least one spring member integral with the shield body. The at least one spring member is adapted to engage the chassis such that the spring member is biased against the chassis. Preferably, the at least one spring member includes a plurality of curved, resilient fingers extending from an edge of the shield body. Preferably, the connector is electrically grounded, the shield includes an aperture defined in the shield body, and the connector extends through the aperture and engages at least an engagement portion of the shield disposed along the aperture.

According to a further aspect of the present invention, an RF emissions shielded connector system includes a connector module and a connector assembly. The connector module includes an electrically conductive chassis and a first connector mounted on the chassis. The connector assembly includes a backplane assembly and a shield for grounding the chassis. The backplane assembly includes a backplane and a second connector extending from the backplane and adapted to engage the first connector. The shield is secured to the backplane assembly and includes an electrically grounded shield body and at least one spring member integral with the shield body. The at least one spring member is adapted to engage the chassis when the first and second connectors are engaged such that the spring member is biased against the chassis. Preferably, the at least one spring member includes a plurality of curved, resilient fingers extending from an edge of the shield body. Preferably, the second connector is electrically grounded, the shield includes an aperture defined in the shield body, and the second connector extends through the aperture and engages at least an engagement portion of the shield disposed along the aperture.

According to another aspect of the present invention, a method for connecting a connector module having a chassis to a backplane assembly including a backplane and a connector extending from the backplane includes mounting a grounding shield on the backplane assembly such that the shield is electrically grounded to the backplane assembly. The shield includes a shield body and at least one spring member integral with the shield body. Thereafter, the connector module is connected to the backplane assembly such that the at least one spring member engages and is biased against the chassis.

Objects of the present invention will be appreciated by those of ordinary skill in the art from a reading of the Figures and the detailed description of the preferred embodiments which follow, such description being merely illustrative of the present invention.

BRIEF DESCRIPTION OF THE DRAWINGS

FIG. 1 is a perspective view of a shield according to the present invention;

FIG. 2 is a perspective view of a connector assembly according to the present invention and incorporating the shield of FIG. 1;

DETAILED DESCRIPTION OF PREFERRED EMBODIMENTS

Figure 3:
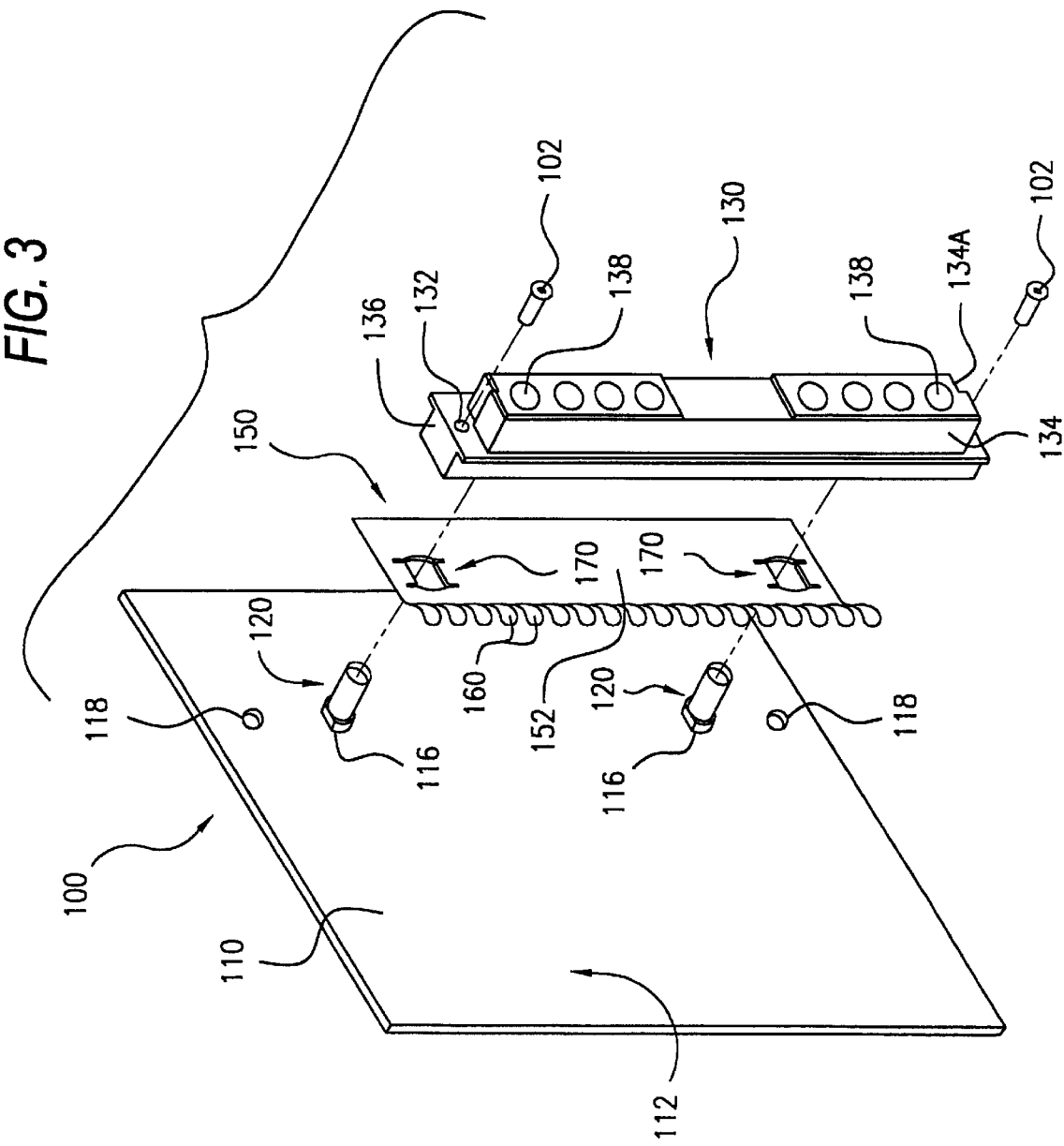
FIG. 3 is an exploded, perspective view of the connector assembly of FIG. 2.

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, like numbers refer to like elements throughout and the thickness of elements may be exaggerated for clarity.

Figure 6:
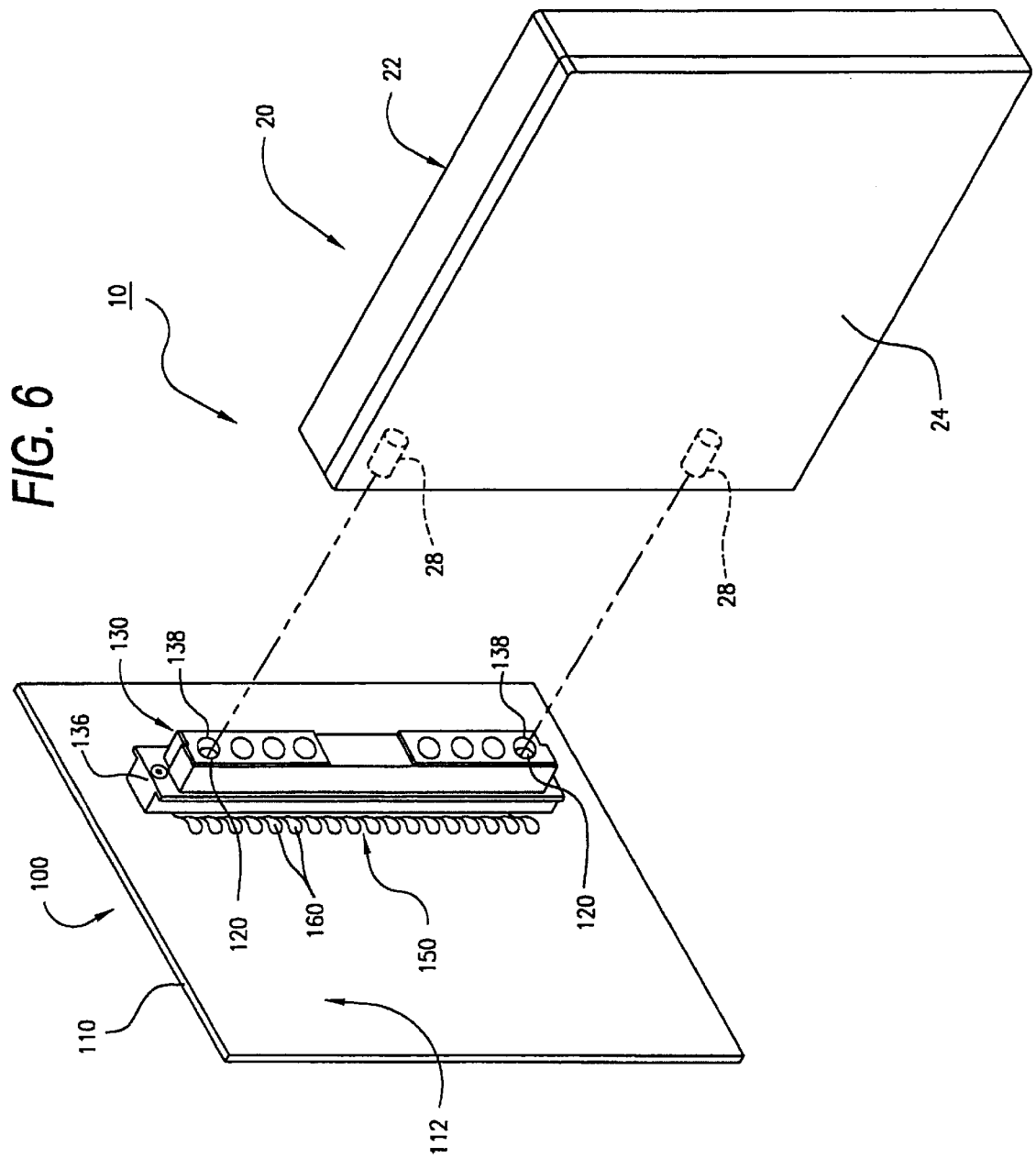
FIG. 6 is an exploded, perspective view of a connector system including the connector assembly of FIG. 2 and a connector module.
Figure 7:
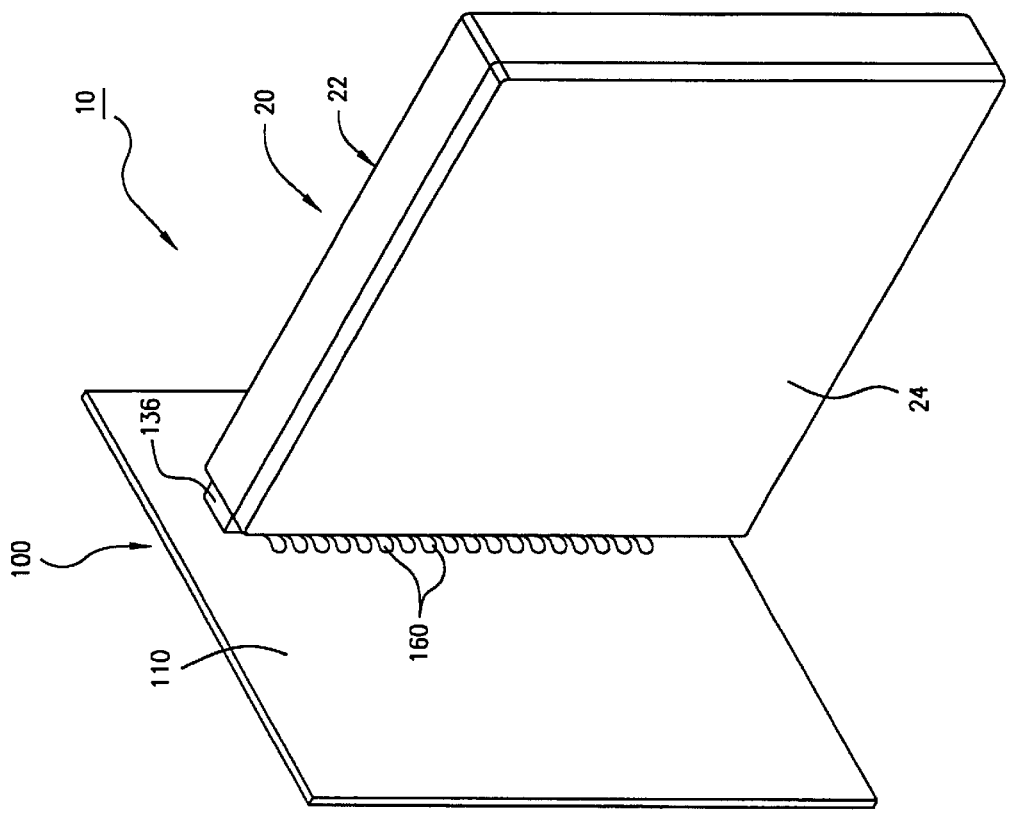
FIG. 7 is a perspective view of the connector system of FIG. 6 wherein the connector assembly and the connector module are connected.

With reference to FIGS. 6 and 7, a connector system 10 according to the present invention is shown therein. The connector system 10 includes generally an electronic module 20 and a connector assembly 100. The connector assembly 100 may be, for example, an RF distribution backplane of a cellular base station, and the module 20 may be an RF module or any other type of module which emits radio frequencies. The module 20 and the connector assembly 100 may be of conventional construction as appropriate for the intended application, except for the provision of a shield 150 of the present invention. The shield 150 as well as the connector assembly 100 and the connector system 10 incorporating the shield 150 are described in greater detail hereinbelow.

Figure 9:
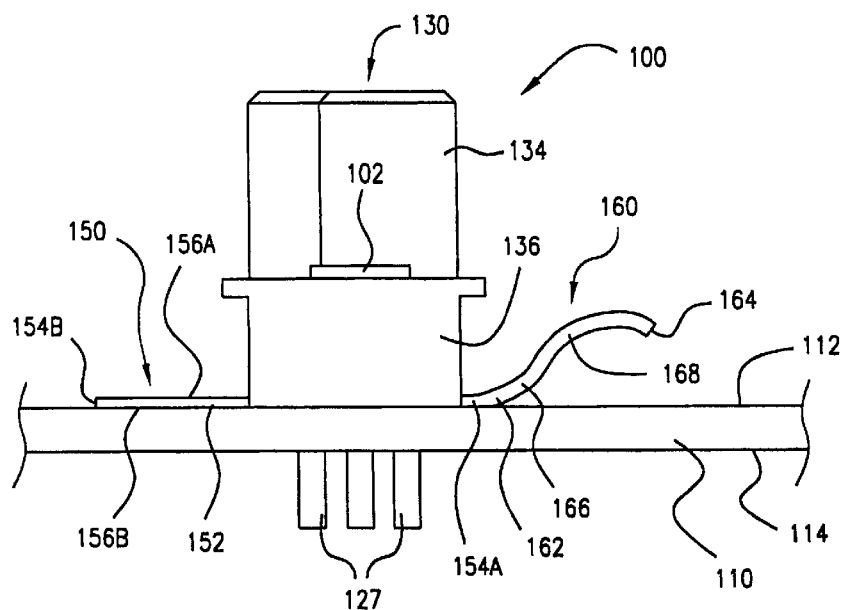
FIG. 9 is an enlarged, fragmentary, side elevational view of the connector assembly of FIG. 2.

With reference to FIG. 1, the shield 150 is formed of an electrically conductive material and includes a body 152 having an outer face 156A and an opposed inner face 156B. The body 152 also has opposed side edges 154A and 154B, as well as opposed end edges 154C and 154D. Apertures 170 are formed through the body 152 adjacent the end edges 154C, 154D. An inner edge portion 172 of the body 152 surrounds each of the apertures 170. The inner edge portion 172 includes opposed arcuate portions 174 and opposed tabs 176. The tabs 176 extend inwardly into the respective apertures 170. A plurality of spring members or fingers 160 extend outwardly from the edge 154A and define slots 160A between adjacent fingers 160. The fingers 160 also extend outwardly beyond the outer face 156A. As best seen in FIGS. 1 and 9, each finger 160 has an end 162 integral with the body 152, an opposite, free end 164, a concave first portion 166 and a convex second portion 168. Preferably, each finger 160 is integrally formed with the body 152. Preferably, the fingers 160 extend between about 0.050 and 0.25 inch outwardly beyond the outer face 156A. Preferably, the shield 150 has a uniform material thickness throughout. More preferably, the thickness of the shield 150 is between about 0.003 and 0.005 inch throughout. Preferably, the shield 150 is formed of the same material throughout. Suitable materials include beryllium copper and stainless steel. Suitable materials may include commercially available finger stock stamped to provide the desired outer shape and to form the apertures 170. Portions of the shield 150 may be formed of or coated with nonconductive material. Additional fingers (not shown) may extend from one or more of the outer edges 154B, 154C, 154D as well.

With reference to FIGS. 2 and 3, and as noted above, the shield 150 is incorporated into the connector assembly 100. The connector assembly 100 includes a backplane 110, the shield 150, connectors 120 and a shroud 130. The several components of the connector assembly 100 will be described with reference to the steps for assembling the connector assembly 100.

The backplane 110 has an outer face 112 and an opposed, inner face 114. Rivet holes 118 are formed through the backplane 110. The backplane 110 may be formed of conventional construction. The outer face 112 of the backplane 110 is electrically non-conductive and conductive elements such as printed circuits are disposed on the inner face 114 or on internal layers of the backplane 110.

Figure 5:
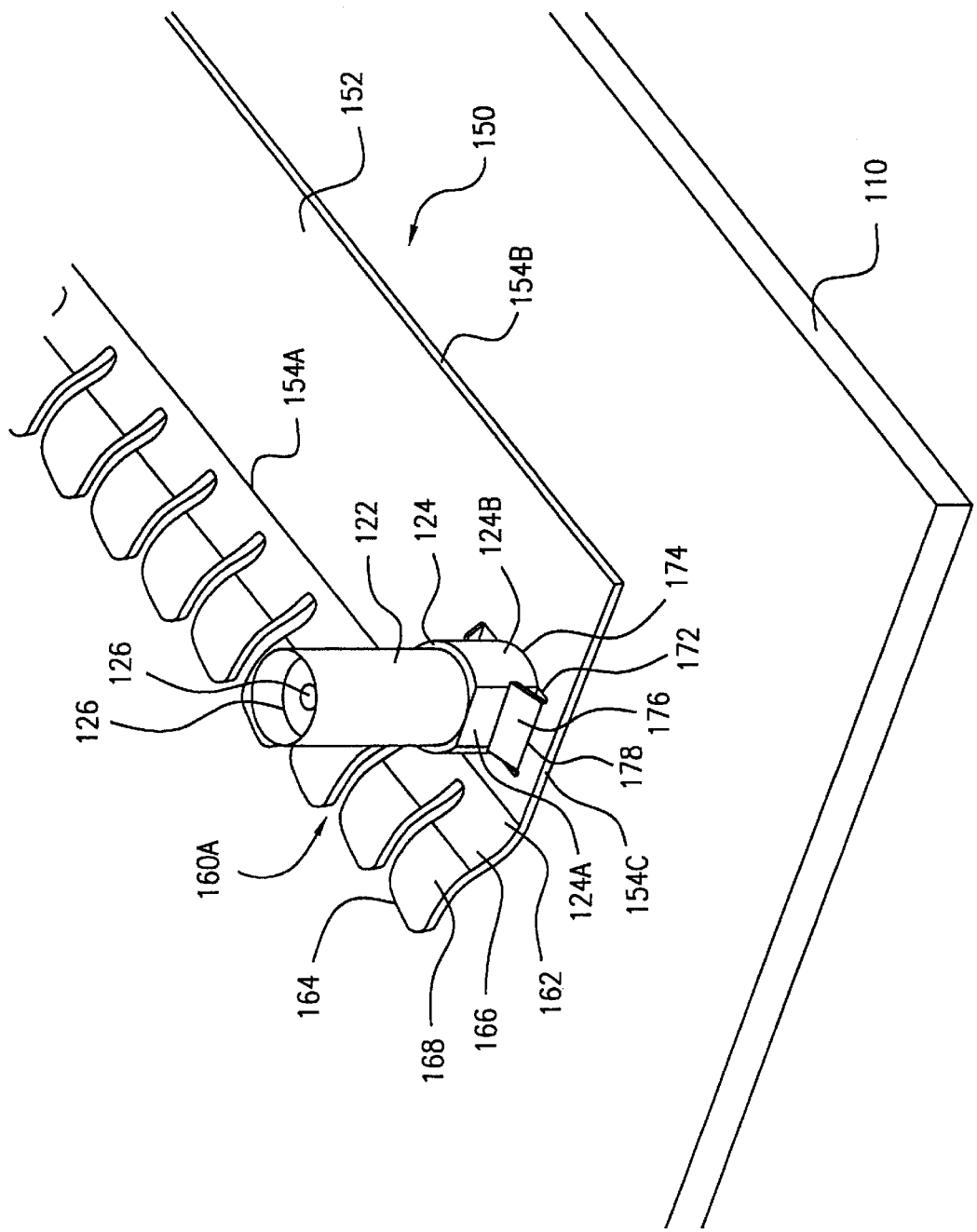
FIG. 5 is an enlarged, perspective view of detail A of FIG. 4.

The connectors 120 extend through the backplane 110 through holes 116 from the inner face 114 to the outer face 112 and project above the outer face 112 as shown. The connectors 120 may be any suitable connectors, including DIN type connectors as shown. The connectors 120 are each grounded on the inner face 114 side or the internal layers of the backplane 110 (not shown). The connectors 120 are secured in position by any suitable means to resist displacement into or out of the backplane 110 or rotation with respect to the backplane 110. With reference to FIG. 5, each connector 120 has an upper portion 122 and abase portion 124. At least the base portion 124 is grounded by connection to the inner side or internal layers of the backplane 110. Each connector 120 also has connection contacts 126 for engagement with the associated contacts of the module 20. The connection contacts 126 are connected to pins 127 which extend from the inner side of the backplane 110 (see FIGS. 9 and 10). Means and methods for mounting connectors on backplanes as just described are well known to those of skill in the art and suitable constructions will be readily apparent to those of skill in the art upon a reading of the description herein.

Figure 4:
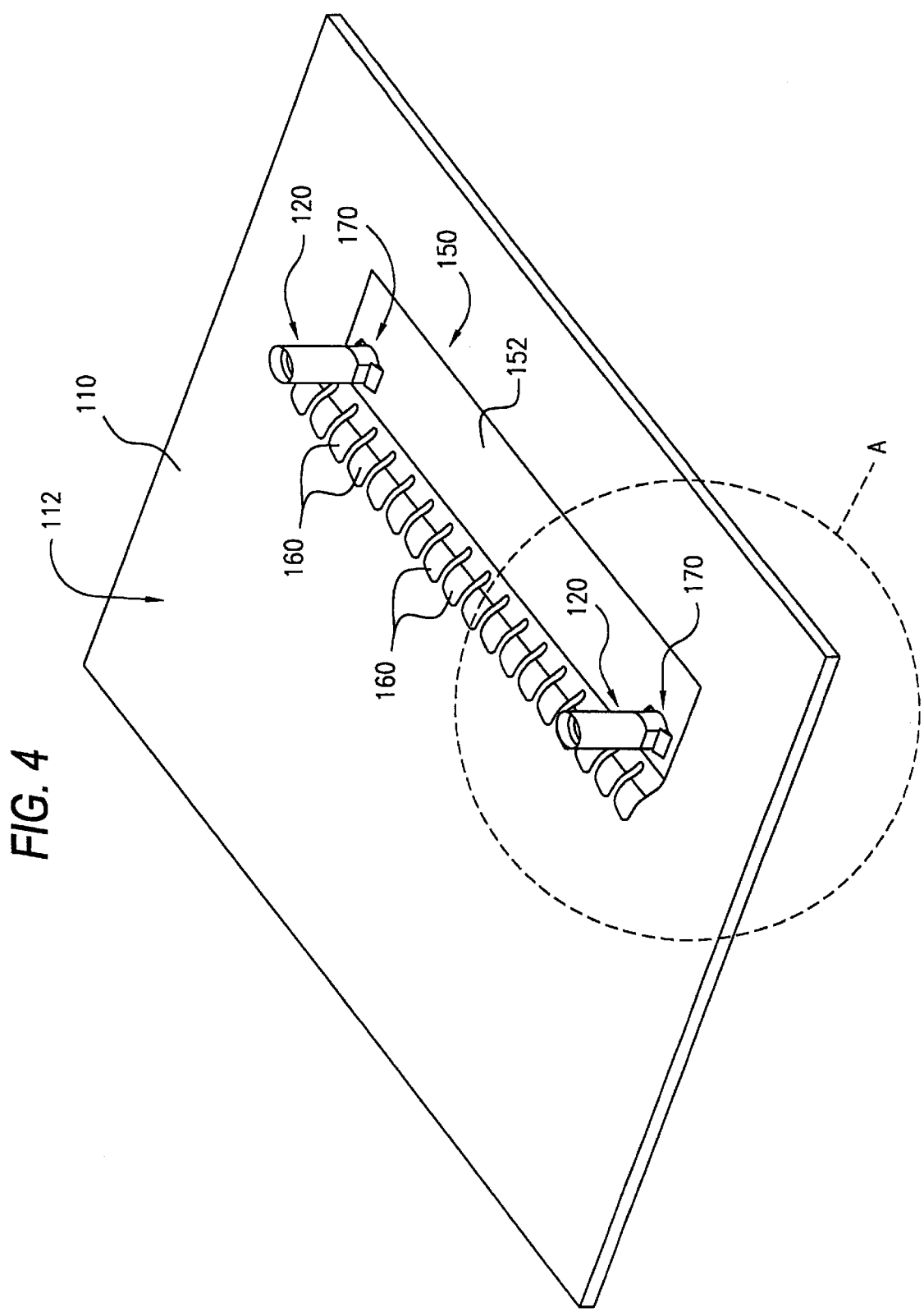
FIG. 4 is a perspective view of a backplane, connectors and the shield of the connector assembly of FIG. 2.

After the connectors 120 have been mounted on the backplane 110, the shield 150 is placed over the backplane 110 and the connectors 120 such that the connectors 120 are inserted through the apertures 170. The shield 150 is seated on the connectors 120 by pushing the shield 150 down over the connector bases 124 until the inner face 156B of the shield 150 abuts the outer face 112 of the backplane 110 to assume the position as shown in FIG. 4. As best seen in FIG.

5, the apertures 170 are sized and shaped to provide close fit between the inner edges 172 and the bases 124. In particular, the curved edges 174 are substantially complementary to the curved portions 124B. Additionally, the tabs 176 are deflected about respective folds 178 and engage the adjacent flat walls 124A of the base portions 124. As a result, the tabs 176 serve as resilient, biased clips to resist removal of the shield 150 from the connectors 120. The tabs 176 thereby can provide both metal to metal, electrical contact for grounding and mechanical securement to hold the shield 150 in place on the backplane 110. The complementary shapes of the bases 124 and the apertures 170 facilitate location or registry of the shield 150 relative to the connectors 120 so that the shield is self-aligning. Notably, no tape, adhesive or fasteners (e.g. rivets, screws, or separate clips) are needed.

After the shield 150 is seated on the backplane 110 and the connectors 120 as shown in FIG. 4, the shroud 130 is mounted on the backplane 110. The shroud 130 has an upper portion 134, a base portion 136 and slots 138 extending fully through the shroud 130. Recesses 134A maybe formed in the upper portion 134 in conventional manner to key the connector assembly 100 to the module 20 as desired. The shroud 130 is placed over the shield 150 and the connectors 120 such that the connectors 120 are inserted into the slots 138. The shroud 130 is pushed onto the connectors 120 until the bottom of the base portion 136 abuts the upper face 156A of the shield 150, thereby sandwiching the shield 150 between the backplane 110 and the shroud 130. Reliefs may be formed in the lower edges of the shroud 130 to accommodate the thickness of the shield body 152. Rivets 102 are installed through holes 132 and the holes 118. The shroud 130 is preferably molded from glass reinforced thermoplastic. Notably, upon completion of the assembly of the connector assembly 100, the fingers 160 extend outwardly from the side edge of the shroud 130 and above the outer face 112 of the backplane 110 (see FIGS. 2 and 9).

Figure 8:
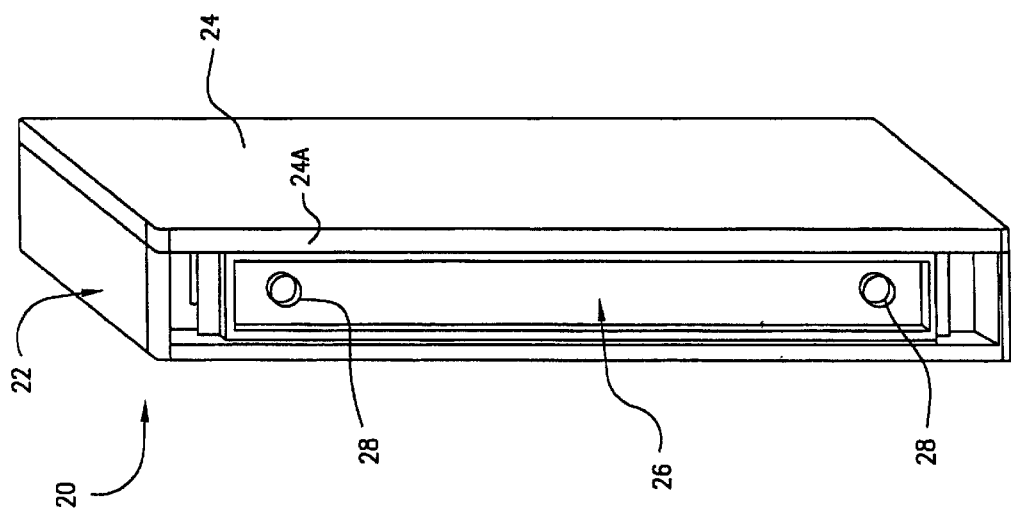
FIG. 8 is a perspective view of the connector module of FIG. 6.

With reference to FIG. 8, the module 20 has a chassis 22 formed of conductive material such as aluminum. The chassis 22 defines a front slot 26 within which connectors 28 are disposed. The chassis 22 includes a sidewall 24 having a front end edge 24A. The construction of the module 20 is conventional and may be modified as appropriate.

When one desires to connect the module 20 to the connector assembly 100, the module 20 is inserted onto the connector assembly 100 such that the shroud 130 is received in the slot 26 and the connectors 28 engage the complementary connectors 120 in conventional manner. The shroud 130 serves as the connector body and as a guide for mating the connectors 28 on the module 20 with the connectors 120 during insertion. The shroud 130 also serves as a retainer housing for the connectors 28, 120.

Figure 10:
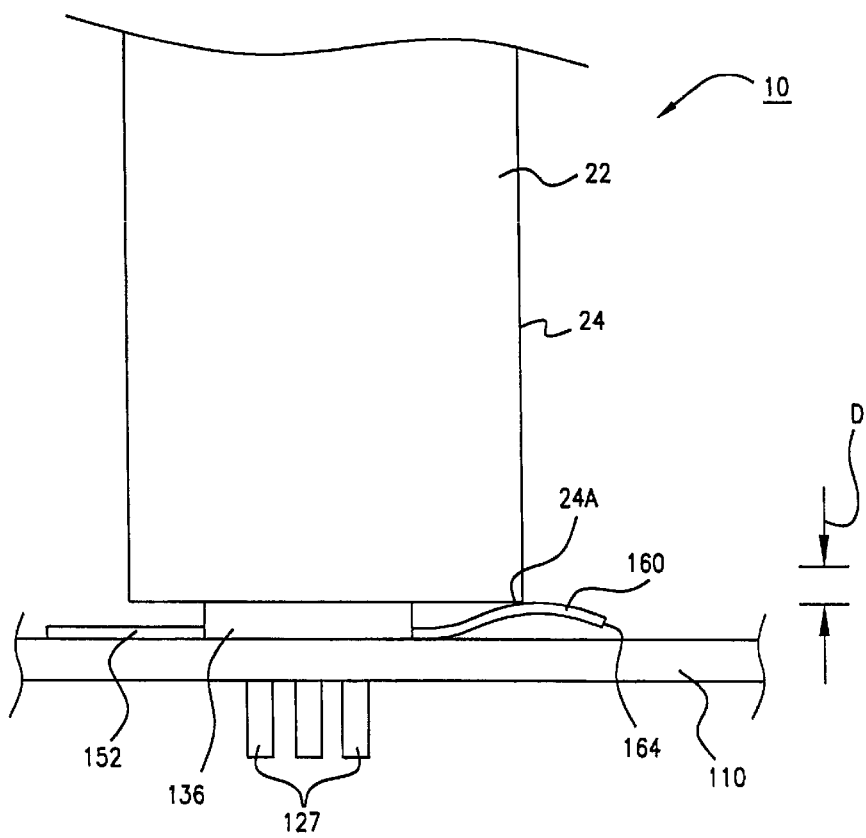
FIG. 10 is an enlarged, fragmentary, side elevational view of the connector system of FIG. 6, wherein the connector module is connected to the connector assembly.

FIGS. 7 and 10 show the module 20 and the connector assembly 100 once connected to one another. With reference to FIG. 10, as the chassis 22 is inserted over the shroud 130, the electrically conductive side wall 24 abuts the fingers 160 and deflects the fingers 160 downwardly toward the backplane 110. Preferably, the chassis 22 displaces the fingers 160 downwardly a distance D of between about 0.050 and 0.150 inch. Because the fingers 160 are resilient, the fingers remain spring biased against the abutting end edge 24A of the wall 24. In this manner, electrical contact is maintained between the shield 150 and the chassis 22. Because the shield 150 is electrically connected to the grounded connectors 120, the chassis 22 is thereby grounded.

The foregoing shield 150, connector assembly 100, and connector system 10 can provide several significant advantages and benefits. The shield 150 may be installed without requiring any additional operation such as clearing or preparation, by machine or by hand. No modifications or alterations to the connectors 120, the connector shroud 130, or the backplane board 110 are needed to use the shield 150. Thus, the shield 150 may be used with a variety of different types and configurations of connectors with no or little modification. Moreover, the presence of the shield 150 need not adversely impact the handling, usability or effectiveness of the connector system or require modification of other components. The spring fingers 160 can deflect and maintain contact with the module chassis 22 after insertion, regardless of slight tolerance differences in depth of insertion, or thermal expansion and contraction. The plurality of fingers 160 arranged in series can ensure that good contact is provided even if the module 20 is not well-aligned with the connector assembly 100. In this manner, good electrical ground contact can be made and maintained between the module 20 and the shield 150, and thereby between the module 20 and the connectors 120. Because adhesives are not required, the connector assembly 100 is well suited for outdoor use.

The module chassis 22 itself provides an RF shield on all sides except its rear face. The shield 150 forms the missing shield side when the module 20 is mounted on the connector assembly 100.

Those of skill in the art will recognize that the shield and the assemblies and systems described above may be used with or incorporate types of connectors, chassis, shrouds and backplanes than those described herein. Moreover, the shield may be shaped and sized differently than as shown and described herein.

It is also contemplated that shields such as or similar to the shield 150 may be secured to the backplane by means other than or in addition to the apertures 170 and the tabs 176. Such means may include adhesives, screws, rivets or separately formed clips. However, such means are generally not preferred because they may be unsuitable for outdoor use (e.g., because of the use of adhesives), may present additional assembly steps or parts and complexity (e.g., screws, rivets and clips), and/or may adversely affect the performance or require modification of the connector system.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. An RF emissions shield for grounding a separately formed chassis to an associated connector mounted on a backplane, said shield comprising:

a) a shield body;
b) mounting means for securing said shield body to the backplane, wherein said mounting means includes an aperture defined in said shield body, said aperture sized and configured to receive the connector such that at least an engagement portion of said shield body along said aperture directly engages the connector;
c) grounding means for electrically connecting said shield body to the connector, wherein said grounding means is separately formed from the chassis; and
d) at least one spring member integral with said shield body and adapted to engage the chassis such that said spring member is biased against the chassis.

2. The shield of claim 1 wherein said at least one spring member includes a plurality of curved, resilient fingers integrally formed with said shield body and extending from an edge of said shield body.

3. The shield of claim 1 wherein said shield body is substantially planar.

4. The shield of claim 3 including a tab integral with said shield body and extending into said aperture, said tab adapted to be deflected by and engage the connector when the connector is inserted into said aperture.

5. The shield of claim 3 wherein said grounding means includes said engagement portion.

6. An RF emissions shield for grounding a separately formed chassis to an associated connector mounted on a backplane, said shield comprising:
a) a shield body having an edge;
b) an aperture defined in said shield body, said aperture sized and configured to receive the connector such that at least an engagement portion of said shield body along said aperture directly engages the connector to secure said shield body to the backplane and to electrically connect said shield body to the connector; and
c) a plurality of curved, resilient spring fingers integrally formed with said shield body and extending from said edge.

7. The shield of claim 6 wherein said shield body is substantially planar.

8. The shield of claim 7 wherein said plurality of spring fingers extend above the plane of said shield body.

9. The shield of claim 6 including a tab integral with said shield body and extending into said aperture, said tab adapted to be deflected by and engage the connector when the connector is inserted into said aperture.

10. An RF emissions shielded connector assembly for use with a separately formed chassis, said connector assembly comprising:
a) a backplane assembly including: a backplane; and a connector extending from said backplane; and
b) a shield for grounding the chassis, said shield secured to said backplane assembly and including:
an electrically grounded shield body; and
at least one spring member integral with said shield body and adapted to engage the chassis such that said spring member is biased against the chassis;
c) wherein said connector is electrically grounded, said shield includes an aperture defined in said shield body, and said connector extends through said aperture and directly engages at least an engagement portion of said shield disposed along said aperture.

11. The connector assembly of claim 10 wherein said at least one spring member includes a plurality of curved, resilient fingers integrally formed with said shield body and extending from an edge of said shield body.

12. The connector assembly of claim 10 wherein said shield body is substantially planar.

13. The connector assembly of claim 12 including a tab integral with said shield body and extending into said aperture, said tab being bent outwardly and engaging said connector.

14. The connector assembly of claim 13 wherein said connector includes an upper portion and a base portion having a greater diameter than said upper portion, said tab engaging said base portion.

15. The connector assembly of claim 10 including a connector shroud overlying said backplane, wherein said shield body is interposed between said backplane and said connector shroud.

16. The connector assembly of claim 15 wherein said at least one spring member extends outwardly beyond a side edge of said connector shroud.

17. An RF emissions shielded connector assembly for use with a chassis, said connector assembly comprising:
a) a backplane assembly including:
a backplane; and
a connector extending from said backplane; and
b) a shield for grounding the chassis, said shield secured to said backplane assembly and including:
an electrically grounded, substantially planar shield body;
an aperture defined in said shield body, said aperture sized and configured to receive said connector such that at least an engagement portion of said shield body along said aperture engages said connector to secure said shield body to said backplane and to electrically connect said shield body to said connector; and
a plurality of curved, resilient spring fingers extending from an edge of and integral with said shield body and adapted to engage the chassis such that at least some of said fingers are biased against the chassis.

18. The connector assembly of claim 17 including a tab integral with said shield body and extending into said aperture, said tab being bent outwardly and engaging said connector.

19. The connector assembly of claim 18 wherein said connector includes an upper portion and a base portion having a greater diameter than said upper portion, said tab engaging said base portion.

20. The connector assembly of claim 17 including a connector shroud overlying said backplane, wherein said shield body is interposed between said backplane and said connector shroud.

21. The connector assembly of claim 20 wherein said plurality of fingers extend outwardly beyond a side edge of said connector shroud.

22. An RF emissions shielded connector system comprising:
a) a connector module including:
an electrically conductive chassis; and
a first connector mounted on said chassis;
wherein said chassis has a front edge adjacent said first connector; and
b) a first connector assembly including:
a backplane assembly including:
a backplane; and
a second connector extending from said backplane and
adapted to engage said first connector; and
a shield for grounding said chassis, said shield secured to said backplane assembly and including:

an electrically grounded shield body; and
at least one spring member integral with said shield body and adapted to engage said front edge of said chassis when said first and second connectors are engaged such that said spring member is biased directly against said front edge of said chassis.

23. The connector assembly of claim 22 wherein said at least one spring member includes a plurality of curved, resilient fingers integrally formed with said shield body and extending from an edge of said shield body.

24. The connector assembly of claim 22 wherein said shield body is substantially planar.

25. The connector assembly of claim 22 wherein said second connector is electrically grounded, said shield includes an aperture defined in said shield body, and said second connector extends through said aperture and directly engages at least an engagement portion of said shield disposed along said aperture.

26. The connector assembly of claim 25 including a tab integral with said shield body and extending into said aperature, said tab being bent outwardly and engaging said second connector.

27. The connector assembly of claim 22 wherein said second connector includes an upper portion and a base portion having a greater diameter than said upper portion, said tab engaging said base portion.

28. The connector assembly of claim 22 including a connector shroud overlying said backplane, wherein said shield body is interposed between said backplane and said connector shroud.

29. The connector assembly of claim 28 wherein said at least one spring member extends outwardly beyond a side edge of said connector shroud.

30. A method for connecting a connector module having a chassis and a first connector to a backplane assembly including a backplane and a second connector extending from the backplane, the chassis having a front edge adjacent the first connector, said method comprising the steps of:

mounting a grounding shield on the backplane assembly such that the shield is electrically grounded to the backplane assembly, the shield including a shield body and at least one spring member integral with the shield body; and thereafter connecting the connector module to the backplane assembly such that the first connector is joined with the second connector and the at least one spring member engages and is biased directly against the front edge of the chassis.

31. The method of claim 30 including the step of placing a connector shroud over a portion of the shield prior to said step of connecting.

\* \* \* \* \*

UNITED STATES PATENT AND TRADEMARK OFFICE
CERTIFICATE OF CORRECTION

PATENT NO. : 6,264,480 B1
DATED : July 24, 2001
INVENTOR(S) : Nealis et al.

It is certified that error appears in the above-identified patent and that said Letters Patent is hereby corrected as shown below:

<u>Column 8,</u>
Line 60, delete "first".

<u>Column 9,</u>
Line 23, delete "22" and insert -- 26 --.

Signed and Sealed this

Fourteenth Day of May, 2002

*Attest:*

JAMES E. ROGAN
*Attesting Officer*    *Director of the United States Patent and Trademark Office*